United States Patent [19]

Nakao et al.

[11] Patent Number: 5,234,501
[45] Date of Patent: Aug. 10, 1993

[54] OXIDATION METOD

[75] Inventors: Ken Nakao, Sagamihara; Sadao Maruchi, Hachioji; Yoshio Sakamoto, Machida, all of Japan

[73] Assignee: Tokyo Electron Sagami Limited, Kanagawa, Japan

[21] Appl. No.: 825,422

[22] Filed: Jan. 24, 1992

Related U.S. Application Data

[60] Division of Ser. No. 554,448, Jul. 19, 1990, abandoned, which is a continuation-in-part of Ser. No. 237,416, Aug. 29, 1988, abandoned.

[30] Foreign Application Priority Data

Sep. 1, 1987 [JP] Japan ............... 62-133339[U]
Dec. 17, 1987 [JP] Japan ............... 62-319916

[51] Int. Cl.⁵ ................................ C23C 16/00
[52] U.S. Cl. ..................... 118/719; 118/715; 118/724; 118/725; 427/255.3; 427/255.4
[58] Field of Search ........... 437/247, 239; 29/25.01; 118/715, 719, 725, 724; 427/255.3, 255.4

[56] References Cited

U.S. PATENT DOCUMENTS

| | | | |
|---|---|---|---|
| 3,306,768 | 2/1967 | Peterson | 427/255.3 |
| 3,511,703 | 5/1970 | Peterson | 427/255.3 |
| 3,517,643 | 6/1970 | Goldstein | 118/715 |
| 3,837,905 | 9/1974 | Hile et al. | 437/239 |
| 4,018,184 | 4/1977 | Nagasawa | 118/715 |
| 4,167,915 | 9/1979 | Toole | 118/708 |
| 4,268,538 | 5/1981 | Toole | 427/255.3 |
| 4,275,094 | 6/1981 | Takasi et al. | 437/239 |
| 4,315,479 | 2/1982 | Toole | 118/715 |

FOREIGN PATENT DOCUMENTS

| | | | |
|---|---|---|---|
| 0072571 | 6/1978 | Japan | 437/239 |
| 0008931 | 1/1986 | Japan | 437/239 |

Primary Examiner—Richard Bueker
Attorney, Agent, or Firm—Oblon, Spivak, McClelland, Maier & Neustadt

[57] ABSTRACT

The invention provides an oxidation method which utilizes a processing tube, a combustion chamber connected to the processing tube, inner and outer coaxial guide tubes connected to the combustion chamber, and an auxiliary combustion chamber connected to the combustion chamber, which includes the steps of placing a plurality of objects at predetermined intervals in the processing tube; generating steam in the combustion chamber by combustion of a mixture of oxygen and hydrogen gases and supplying the steam to the processing tube wherein the steam is generated by individually introducing oxygen gas and hydrogen gas into the combustion chamber through the outer and inner coaxial guide tubes and by heating the hydrogen gas in the inner guide tube or both the inner guide tube and the auxiliary combustion chamber such that ignition of the oxygen and hydrogen gases occurs when the gases come into contact with each other; and preventing a flame generated by the ignition of the gases from reaching an interior surface portion of at least one of the auxiliary combustion chamber and the combined chamber.

16 Claims, 7 Drawing Sheets

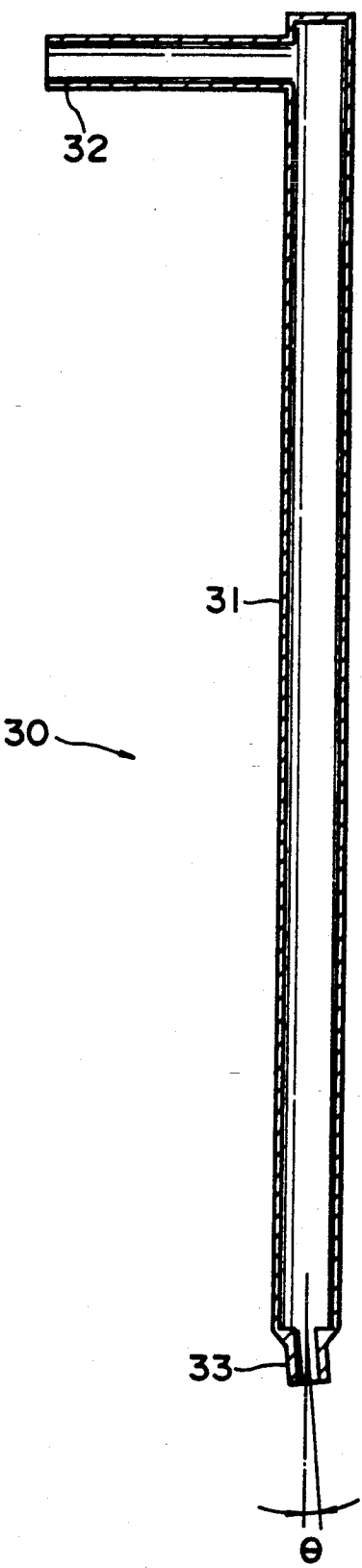
F I G. 4

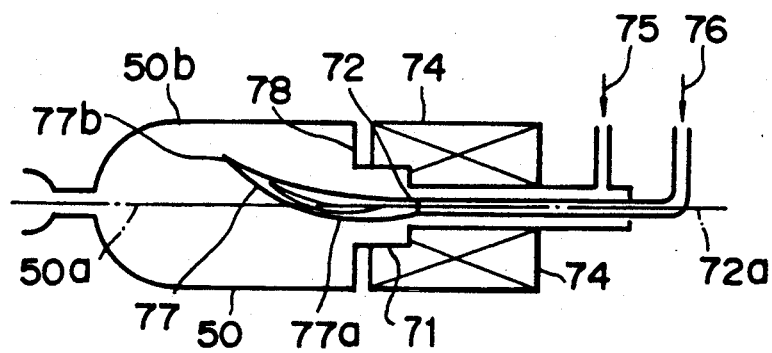
FIG. 9
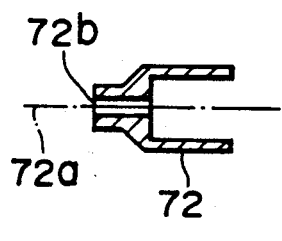   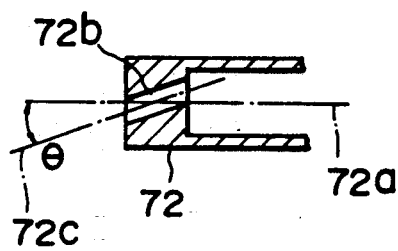
FIG. 10A    FIG. 10B
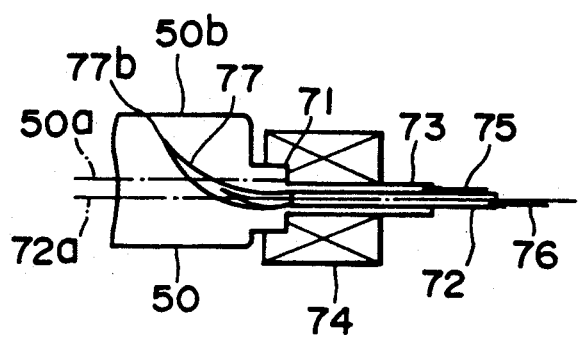
FIG. 11

5,234,501

OXIDATION METOD

CROSS-REFERENCES TO THE RELATED APPLICATIONS

This application is a division of application Ser. No. 07/554,448, filed on Jul. 19, 1990, now abandoned, which is a continuation-in-part of application Ser. No. 237,416, filed on Aug. 29, 1988 and now abandoned.

BACKGROUND OF THE INVENTION

1. Field of the Invention

The present invention relates to an oxidation apparatus for forming an oxide film on an object to be processed such as a semiconductor wafer (to be referred to as a wafer hereinafter).

2. Description of the Related Art

A conventional oxide furnace is of a horizontal type. In such a horizontal furnace, a boat on which 150 wafers for example are mounted must be loaded in/unloaded from a process tube by a cantilever fork. However, a deposit is adhered to the inner wall surface of the furnace and the boat by the last annealing step. Therefore, if the fork flexes by its own weight, the deposit adhered to the boat is separated. As a result, the deposit is adhered to the wafers as dust or an impurity.

In addition, the horizontal oxidation furnace requires a large installation space. However, the cost per unit area in a clean room is high. Therefore, a strong demand has arisen for space saving of an oxidation furnace especially for wafers. However, the conventional horizontal oxidation furnaces cannot satisfy this requirement.

As for the above mentioned problems, it is difficult to automatically control the horizontal furnace or to increase its diameter. In addition, in the horizontal furnace, a temperature difference is produced between spaces above and below a wafer due to convection in the furnace, resulting in a poor yield. Furthermore, the intake of external $O_2$ is large. As a result, in the horizontal furnace, an unnecessary oxide film is formed and therefore the film thickness on a wafer is difficult to control.

Conventionally, in order to form an oxide film on the surface of a wafer, a wet oxidation method is adopted to obtain a steam atmosphere in a reaction tube.

As the wet oxidation method, a method called pyrogenic oxidation is generally utilized. In this method, as shown in FIG. 1, hydrogen gas 1 and oxygen gas 2 are burned and combined in a combustion chamber to generate steam. This steam is guided to a reaction tube 4 which houses wafers W, thereby obtaining a steam atmosphere in the tube 4.

Note that in FIG. 1, reference numeral 5 denotes a wafer boat; 6, a gas burner; 7, an oxygen supply path; 8, an oxygen and hydrogen flame; and 9, a heater for heating hydrogen gas up to its ignition temperature. Then, high-temperature oxygen and hydrogen flame 8 comes closer to inlet port upper wall portion 10 of combustion chamber 3 to cover portion 10. Since chamber 3 is formed of quartz, it is denatured when it is heated to a high temperature. In the worst case, chamber 3 is melted and broken. According to a conventional steam generation method, hydrogen gas and oxygen gas is combusted and combined in the vicinity of the wall of a combustion chamber made of quartz, in order to prevent an accident explosion due to non-combustion of hydrogen gas.

As a result, the wall of the combustion chamber is heated and the transparency of the wall is lost. In addition, molecules in the wall of quartz, i.e. so called impurities, are dispersed in the combustion chamber and adhere to steam.

If such steam is employed in the oxidizing process or diffusing process of semiconductor devices, the resultant semiconductor devices have low quality. Furthermore, since a tip portion of a hydrogen nozzle must be positioned near a heat source, it is not possible to freely set the location at which hydrogen gas is combusted.

SUMMARY OF THE INVENTION

An object of the present invention is to provide an oxidation apparatus capable of preventing a combustion chamber from losing its transparency, and setting the location of the hydrogen gas.

Another object of the present invention is to provide an oxidation method which can form an oxide film on an object to be processed with a high yield, which can be automatically controlled, and a diameter of which can be increased.

An oxidation apparatus is therefore provided, which comprises a process tube adapted to contain a boat in which a plurality of objects to be processed are placed at predetermined intervals; first heating means for heating an interior of said process tube; a combustion chamber, located outside of and connected to said process tube via a connecting tube, for generating steam by combustion of a mixture of oxygen and hydrogen gases therein and supplying the steam to said process tube; a double-tube type structure connected to said combustion chamber, said double-tube type structure having outer and inner guide tubes for individually introducing the oxygen gas through said outer guide tube and the hydrogen gas through said inner guide tube into said combustion chamber; an auxiliary combustion chamber formed as an outlet portion of said outer guide tube; an injection nozzle formed as an outlet portion of said inner guide tube and located near a front end portion of said auxiliary combustion chamber; and second heating means, provided around said outer guide tube, for heating the gases to a temperature at which ignition of the gases occurs when the gases come into contact with each other wherein said auxiliary combustion chamber comprises an enlargement portion of said outer guide tube sufficient in size to prevent a flame generated by combustion of the gases from reaching a surface of said auxiliary combustion chamber.

According to the present invention, an atmosphere forming means can be used. That is, the atmosphere forming means may be constituted by an external combustion unit for burning oxygen and hydrogen gases to generate steam in a combustion chamber located outside the process tube and supplying the steam to a gas inlet port of the process tube.

The external combustion unit can be used in the present invention, and it may be constituted by guide tubes for independently guiding oxygen gas and hydrogen gas, a heating means, located around one or both of the guide tubes, for heating a gas in the guide tube to an ignition point or more, a combustion chamber for bringing the oxygen and hydrogen gases, at least one of which is heated, into contact with each other and thereby burning and combining the gases into steam, and a supply tube for supplying the steam to a gas inlet port of the process tube.

An auxiliary combustion chamber may be formed between the combustion chamber and the guide tube for hydrogen gas.

According to the oxidation method disclosed in the present invention, combustion gas ($H_2$) is not ignited and combusted by a heater. While $H_2$ gas passes through a heater member, the $H_2$ gas is heated up to the ignition point or above. The heated $H_2$ gas starts combustion in the presence of oxygen. Specifically, the combustion gas supplied along with steam at the flow rate of 15 l/min or above is first put in contact with oxygen at a predetermined location in the combustion chamber. In the combustion chamber, the combustion gas has sufficient heat energy. Thus, the conditions for combustion are satisfied, and combustion of gas at the optimal location in the combustion chamber is carried out.

According to the present oxidation method, when the hydrogen and oxygen gases are supplied to the combustion chamber, the hydrogen gas of the gas burner starts combustion, steam is generated and at the same time oxygen and hydrogen flames are generated. At this time, oxygen and hydrogen flames enter into the combustion chamber through the auxiliary combustion chamber. However, this flame does not heat a portion close to an inlet port upper portion of the combustion chamber.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a schematic view for explaining an arrangement of the hydrogen gas guide tube;

FIG. 9 is a schematic view for explaining still another embodiment of the present invention including an auxiliary combustion chamber;

FIG. 10A is an enlarged sectional view showing a gas burner;

FIG. 10B is an enlarged sectional view showing a gas burner of a still another embodiment; and FIG. 11 is a schematic view for explaining an embodiment in which the gas burner and the combustion chamber are concentric.

DESCRIPTION OF THE PREFERRED EMBODIMENTS

Figure 1:
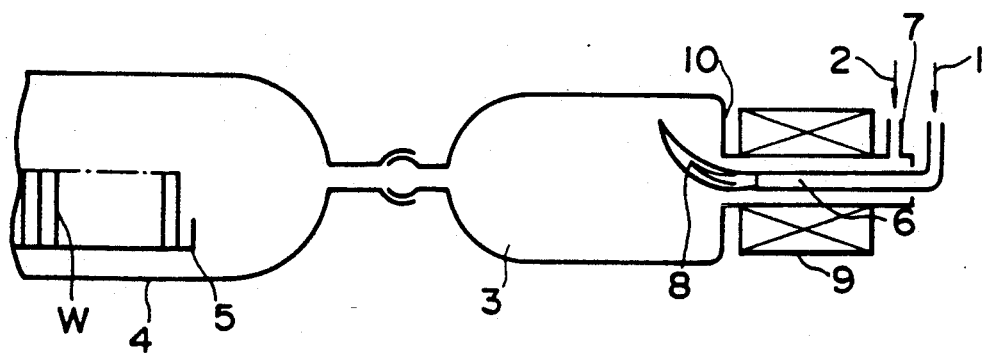
FIG. 1 is a schematic view for explaining a conventional combustion chamber adopting a pyrogenic oxidation method.

An embodiment in which the present invention is applied to a vertical oxidation apparatus for a semiconductor wafer will be described below with reference to the accompanying drawings.

First, a general arrangement of the vertical oxidation apparatus used in the present invention will be described below with reference to FIG. 2. This vertical oxidation apparatus has process tube 11 whose axial direction is vertical. A heating unit, e.g., heater tube 13 is located around process tube 11. Inlet port 12 for guiding steam is formed at an upper end of process tube 11. The heater tube 13 is for example a type of resistance heating.

Quartz boat 14 is housed in process tube 11. Boat 14 supports a plurality of semiconductor wafers (not shown) so that the wafers are horizontally supported and vertically spaced apart from each other. Boat 14 can be vertically transported in process tube 11. Heat insulating cylinder 15 is located at a lower end of boat 14. Cylinder 15 positions boat 14 at a furnace core. Cylinder 15 is vertically moved by loader unit 16. Boat 14 is loaded in/unloaded from process tube 14 by vertical movement of cylinder 15. Note that the uniformity of a temperature and a gas around semiconductor wafers in process tube 11 can be improved by rotatably arranging cylinder 15 so as to rotate the boat 14.

Handler 17 is located below process tube 11. Handler 17 grips and transfers boat 14 to a boat transport unit.

In this apparatus, external combustion unit 10 is formed independently of process tube 11. In other words, the steam generator is located horizontally above the process tube 11. That is, the steam generator is the combustion unit 10 in this embodiment. Unit 10 burns oxygen and hydrogen gases and generates steam. This steam is supplied to gas inlet port 12 at one end portion of process tube 11.

Figure 3:
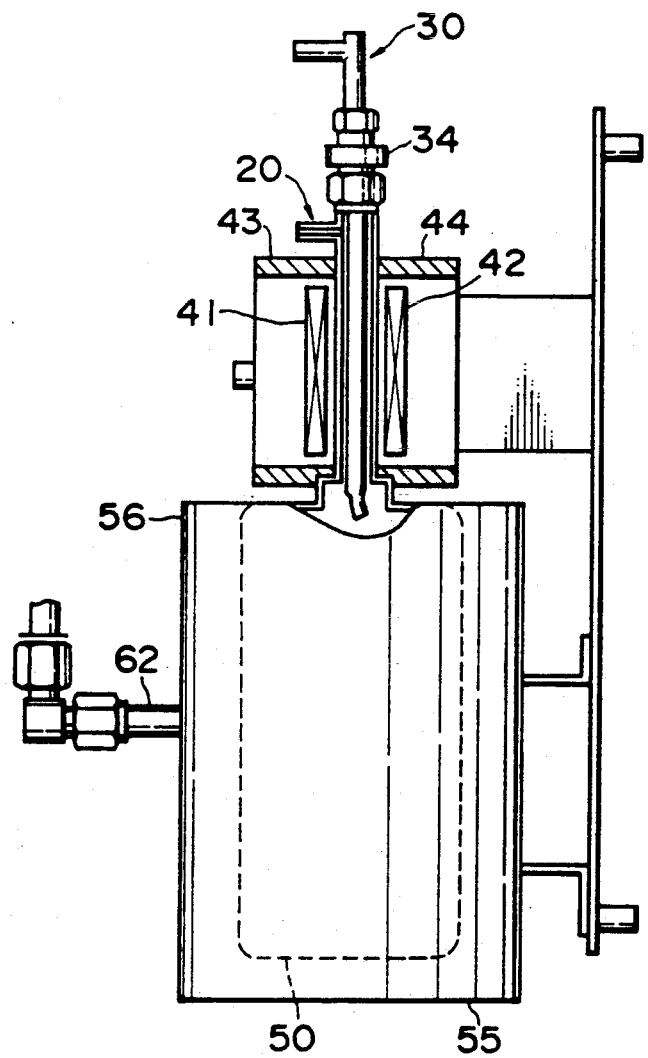
FIG. 3 is a schematic view for explaining a state in which a hydrogen gas guide tube is mounted.

External combustion unit 10 has the following arrangement as shown in FIG. 3.

That is, unit 10 has guide tubes 20 and 30 for independently guiding oxygen gas and hydrogen gas. Preheating means 40 made of half heaters 41, 42 is located around guide tubes 20 and 30. Half heaters 41, 42 heat gases in guide tubes 20 and 30 up to a temperature or more of an ignition point. Half heaters 41, 42 and guide tubes 20 and 30 are connected to combustion chamber 50. In chamber 50, the oxygen and hydrogen gases through the supply tube are burned and combined to generate steam. The generated steam is supplied to inlet port 12 through supply tube 60.

Guide tubes 20 and 30 are formed as a coaxial double tube. That is, hydrogen gas guide tube 30 is arranged inside oxygen gas guide tube 20.

Note that guide tube 20 and chamber 50 are integrally formed. Guide tube 20 and chamber 50 are formed of, e.g., quartz glass. Step structure 21a is formed between guide tube 20 and chamber 50 Guide tube 30 is supported by tube connector 34 as shown in FIG. 3. Nozzle 33 formed at the distal end of guide tube 30 is located in chamber 50.

Figure 6:
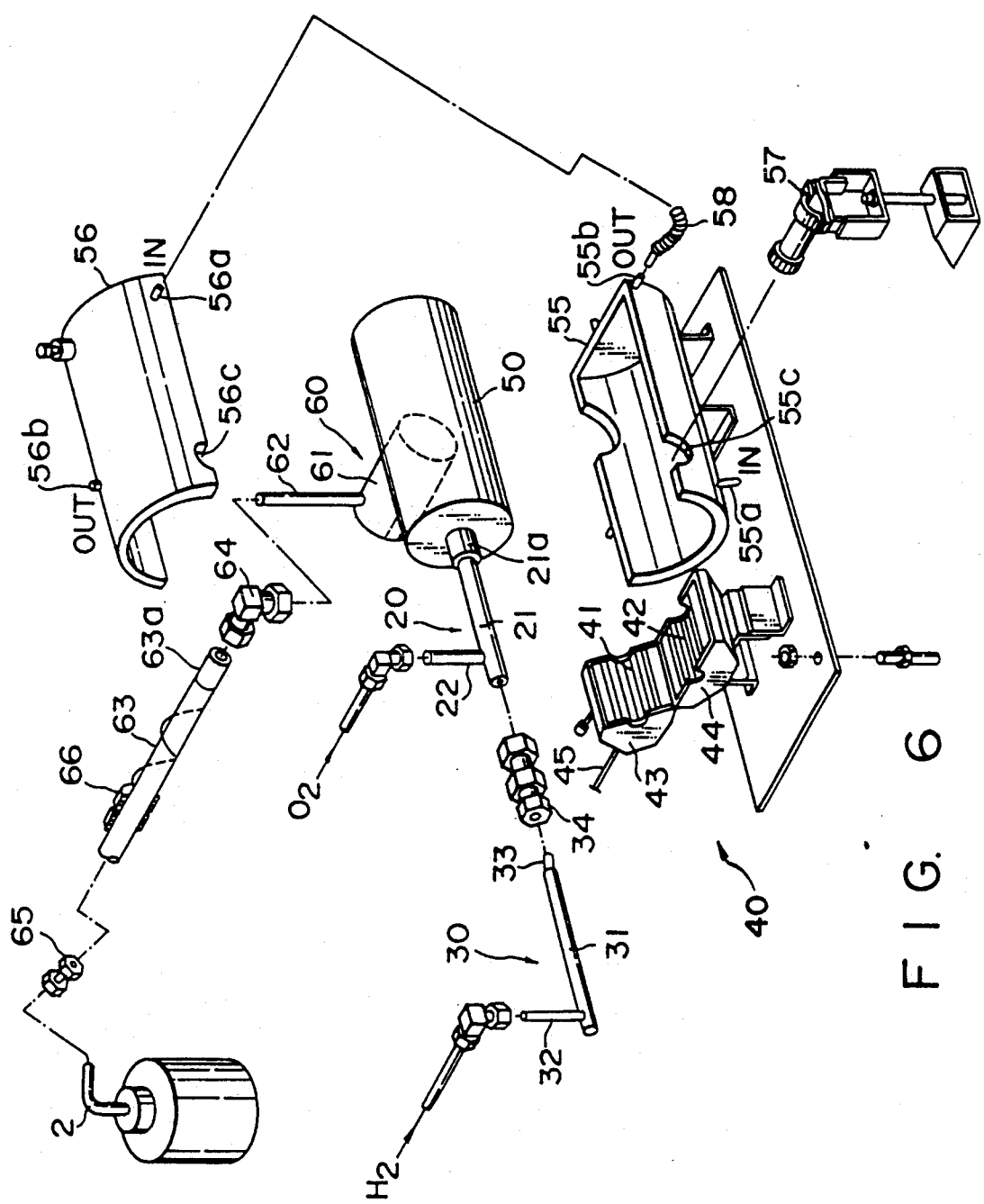
FIG. 6 is an exploded perspective view showing an external combustion unit applied to the oxidation apparatus of the present invention.

As shown in FIGS. 4 and 6, guide tube 30 is formed such that vertical tube 32 for guiding hydrogen gas is formed at one end of horizontal tube 31 and nozzle 33 is formed at the other end thereof. Horizontal tube 31 is, e.g. 8 mm in diameter. Nozzle 33 is inclined downward from the horizontal direction of horizontal tube 31 by a predetermined angle θ. Nozzle 33 is, e.g., 4 mm in diameter smaller than guide tube 30. Angle θ is set to be, e.g., five degrees. As a result, a flame generated by burning the oxygen gas, is not contacted directly with the wall of combustion chamber 50 formed of quartz glass.

Figure 5A:
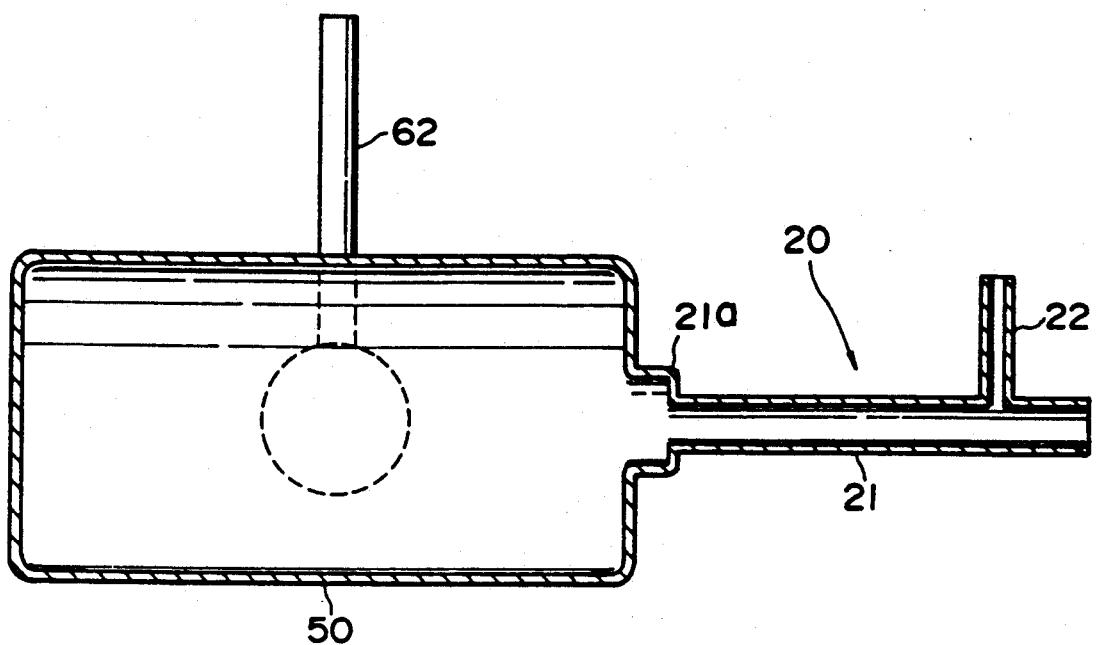
FIG. 5A is a front view showing a combustion chamber, an oxygen guide tube, and a supply tube which are integrally formed.
Figure 5B:
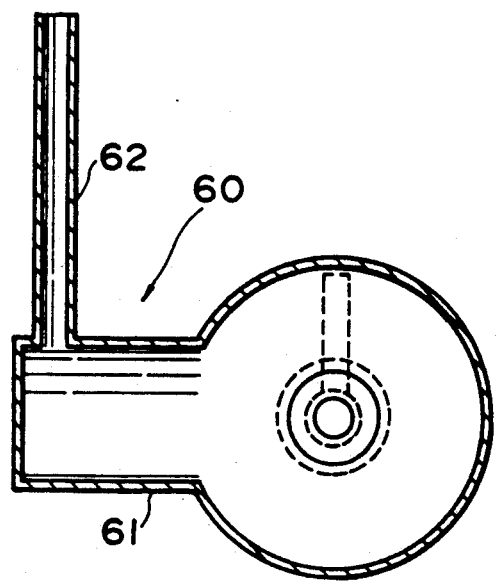
FIG. 5B is a side view showing the combustion chamber, the oxygen guide tube, and the supply tube which are integrally formed.

Combustion chamber 50, oxygen gas guide tube 20, and supply tube 60 which are integrally formed of quartz glass will be described below with reference to FIGS. 5A and 5B.

Guide tube 20 communicates with chamber 50 through large-diameter joint end 21a of horizontal tube 21. Vertical tube 22 branches from the other end of horizontal tube 21. Oxygen gas is guided into chamber 50 through vertical tube 22.

Chamber 50 has guide tube 20 at one end. Supply tube 60 is connected to a central portion on an outer surface of chamber 50. Steam supply tube 60 comprises a large-diameter horizontal tube 61 and a small-diameter vertical tube 62. The small-diameter is set, e.g., as 12 mm. One end portion of horizontal tube 61 communicates with chamber 50. Vertical tube 62 is formed at the other end portion of horizontal tube 61.

In this manner, steam supply tube 60 for oxidation is not formed at the end of chamber 50 opposite to the end connected to oxygen and hydrogen guide tubes 20 and 30. For this reason, the oxidation apparatus can be made compact. In addition, unlike the case wherein supply tube 60 is formed at the end opposite to guide tube 30, a flame can be prevented from directly entering into supply tube 60. In addition, the thermal influence of chamber 50 to the outside can be reduced.

Figure 2:
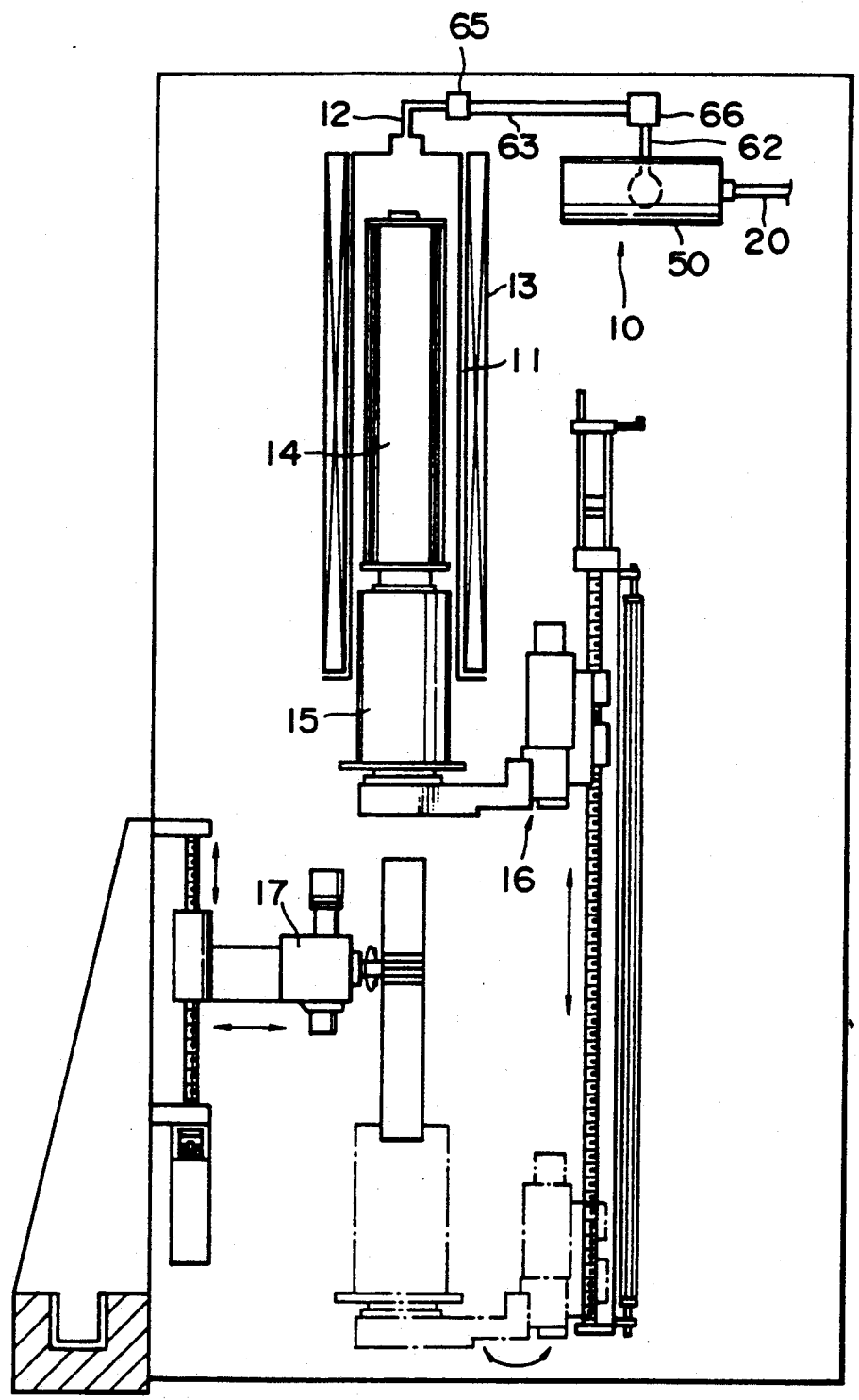
FIG. 2 is a schematic view for explaining a general arrangement of a vertical apparatus.

In order to connect supply tube 60 with inlet port 12, a Teflon (tradename) tube 63 is horizontally located as shown in FIG. 2. Heating portion 66 such as a tape heater for preventing moisture condensation is formed around Teflon tube 63.

In order to connect Teflon tube 63, supply tube 60 and inlet port 12, quartz insert tube 66a is inserted into both ends of Teflon tube 63. These ends are connected with Teflon fittings 64.

Preheating means 40 located around guide tubes 20 and 30 constituting a double tube will be described below referring to FIG. 6. Preheating means 40 is formed by locating half heaters 41 and 42 above and below the double tube in a direction perpendicular to the diameter. Heaters 41 and 42 are supported by box members 43 and 44, respectively. As shown in FIG. 6, box members 43 and 44 are supported so as to be freely opened/closed through a hinge. This structure has the advantage of easy maintenance.

In order to detect temperatures of heaters 41 and 42, an R-type thermocouple 45 is utilized. Thermocouple 45 detects the temperatures so that heating temperatures of heaters 41 and 42 are always maintained at about, e.g., 850° C.

A support member for supporting chamber 50 is formed adjacent to heating means 40. The support member is divided into lower support member 55 and upper support member 56. Inner surfaces of support members 55 and 56 are used as cooling portions for preventing heat dissipation from chamber 50. That is, cooling water inlet ports 55a and 56a and cooling water outlet ports 55b and 56b for circulating cooling water are formed in the inner surfaces of support members 55 and 56, respectively. As the result, the steam generated is cooled at a proper temperature for transporting by the process tube 11. Outlet port 55b of support member 55 is connected to inlet port 56a through SUS flexible tube 58. Notch portions 55c and 56c are formed in side surfaces of support members 55 and 56, respectively. A flame detector 57 for detecting a flame in chamber 50 is located through notch portions 55c and 56c. When detector 57 detects an abnormal flame, an alarm signal is fed back to a system controller.

The oxidation method will now be described along with the operation of the apparatus.

First, quartz boat 14 is loaded in process tube 11. That is, loader unit 16 supports heat-insulating cylinder 15. The central axis of the loader unit 16 coincides with that of the process tube 11. Boat 14 is vertically placed on cylinder 15. In this state, each axis of the wafers loaded on the boat 14 is positioned nearly along the axis of process tube 11. Unit 16 is moved upward to transport boat 14 into process tube 11. Note that since boat 14 is vertically supported, the semiconductor wafers are horizontally located in process tube 11.

In this case, the loading direction of boat 14 coincides with its gravitational direction. For this reason, unlike in a conventional horizontal oxidation furnace, boat 14 is not brought into contact with the inner surface of process tube 11 due to curvature, hanging, or the like of a fork. Therefore, the generation of an impurity can be prevented so as to largely improve the yield of annealing performed on the semiconductor wafers.

A steam atmosphere can be formed in process tube by external combustion unit 10. As for unit 10, a unit of a heat carrying system (Japanese Patent Application No. 62-43751) filed by the present applicant is adopted.

That is, in unit 10, oxygen gas is supplied to oxygen gas guide tube 20 and hydrogen gas is supplied to hydrogen gas guide tube 30 at the flow rate of not more than 15 l/min. Note that the ratio between hydrogen and oxygen gases required for combustion for generating steam is predetermined. However, if a large amount of oxygen gas is supplied, the oxygen gas not used for combustion can be used as a steam carrier to be supplied to process tube 11. It is a matter of course that the oxygen gas is used to form an oxide film.

The oxygen and hydrogen gases are heated to a temperature, e.g., the ignition point or more of the hydrogen gas before they are supplied to chamber 50. The energy required for combustion is given to the oxygen and hydrogen gases by this heating.

The hydrogen gas discharged from nozzle 33 to chamber 50 is instantaneously brought into contact with the oxygen gas and ignites, thereby starting combustion. That is, it is characterized by the fact that preheating for a combustion temperature has been done before mixing the oxygen gas and the hydrogen gas.

According to an experiment, when a temperature of heating means 40 was about 750° C., the hydrogen gas ignited even when the temperature near nozzle 33 was lower than the ignition point of the hydrogen gas, e.g., 382° C. However, when the temperature of the heating means 40 was about 730° C., the hydrogen gas did not ignite.

That is, even when the temperature at the combustion position is lower than an ignition point of hydrogen gas, the hydrogen gas ignites if it is heated up to its ignition point through guide tube 30. Hydrogen gas is heated at, e.g., 850° C. in this embodiment.

Note that neither oxygen gas nor air are present in guide tube 20. Therefore, ignition of the hydrogen gas in guide tube 20 can be prevented.

In this manner, hydrogen and oxygen gases are burned to generate steam. The temperature of the generated steam is more than 2000° C. It is difficult to convey this high temperature steam. Thus, the steam is cooled about 200° C. After that, the steam is supplied into process tube 11 through supply tube 60 and contributes to oxidation of semiconductor wafers (not shown). To get a low temperature steam, supply tube 62 which supplies the steam from chamber 50 to process tube 11, is formed through the wall of the chamber 50. If supply tube 62 is set on the axis of the chamber 50, it is necessary to set the cooling system beside the lower support member 55.

In this case, a flame is generated by combustion in chamber 50. However, since nozzle 33 of guide tube 30 is inclined downward from a horizontal direction, a flame which tends to face upward is not brought into direct contact, or is brought into weak contact with an upper surface of chamber 50. Therefore, a devitrification phenomenon in which chamber 50 formed of quartz is obscured can be prevented. In addition, the quartz is not adhered to steam as an impurity. As a result, such an impurity is not supplied into process tube 11, thereby improving the yield of annealing performed to the semiconductor wafers.

Note that in this embodiment, steam is obtained by burning hydrogen and oxygen gases in external combustion unit 10. For this reason, an adverse influence of heat on process tube 11 during combustion can be prevented. In addition, the uniformity of temperature in process tube 11 can be easily controlled by heater 13. In this the steam is supplied to process tube 11 through Teflon tube 63. Process tube 11 can be located at a position separated away from unit 10. Therefore, an adverse influence on the process tube can be further reduced. For this reason, the uniformity of a temperature at the oxide film formation region in process tube 11 can be easily controlled. In addition, the uniformity of a flow of a wet gas can be assured. As a result, a uniform thickness of the oxide film can be obtained to improve the yield of annealing performed to the semiconductor wafers.

Note that tape heater 66 is used to prevent moisture condensation of steam when the steam is supplied and cooled through Teflon tube 63.

As shown in FIG. 2, since external combustion unit 10 and gas inlet port 12 are connected through horizontally located Teflon tube 63, the space above process tube 11 can be reduced. As a result, the height of the oxidation apparatus can be reduced so that the apparatus can be used in a clean room the ceiling height of which is limited.

External combustion unit 10 used in this embodiment has the following advantages which an external combustion unit used in a conventional horizontal oxidation apparatus disclosed in Japanese Patent Disclosure (Kokai) No. 55-90405 does not have.

That is, in the conventional horizontal oxidation apparatus, a long hydrogen gas guide tube is inserted in a combustion chamber. Therefore, in order to prevent an explosion caused by incomplete combustion of hydrogen gas, hydrogen and oxygen gases are burned and combined near the wall surface of the chamber.

For this reason, a portion near the wall surface is heated so as to cause devitrification, i.e., transparency is lost. In addition, molecules of quartz form the combustion chamber fly in the chamber as an impurity. This impurity is attached to steam particles and is supplied together with the steam into the process tube. In this manner, a large number of poor semiconductor wafers are manufactured by the conventional horizontal oxidation apparatus.

Furthermore, a heat source must be located at the side of the distal end of the hydrogen gas guide tube longitudinally inserted in the combustion chamber. As a result, the arrangement of the apparatus is complicated to manufacture. In addition, the manufacturing cost is increased. In the above mentioned embodiment, a chamber of a horizontal type was described, but, it is a matter of course that a vertical type chamber can also be used. Further, a process tube of a horizontal type or vertical type can be used. In this case, any mixing means for steam generating gas can be used.

A condenser lens is sometimes used as a heat source located at the distal end side of the hydrogen gas guide tube. In this case, however, the combustion position of the hydrogen gas is fixed. For this reason, the combustion position cannot be arbitrarily selected. That is, according to the type of process (especially the type of degree of oxidation), amounts of hydrogen and oxygen gases are varied by an external flow rate controller. In this case, however, the sizes of the flames are different. Therefore, in order to prevent devitrification, the combustion position of the hydrogen gas must be arbitrarily selected. However, this selection is very difficult for the conventional apparatus.

The above embodiment of the present invention does not have a heat source in combustion chamber 50. That is, combustion in chamber 50 can be executed by only heating a gas before it is guided in chamber 50. Therefore, the structure of the apparatus can be simplified. In addition, the manufacturing cost of the apparatus can be reduced. Furthermore, a heat source need not be located at a discharge end side of the gas guide tube. For this reason, the position of the discharge end of the gas guide tube can be arbitrarily selected.

Another embodiment of the present invention will now be described below.

Figure 7:
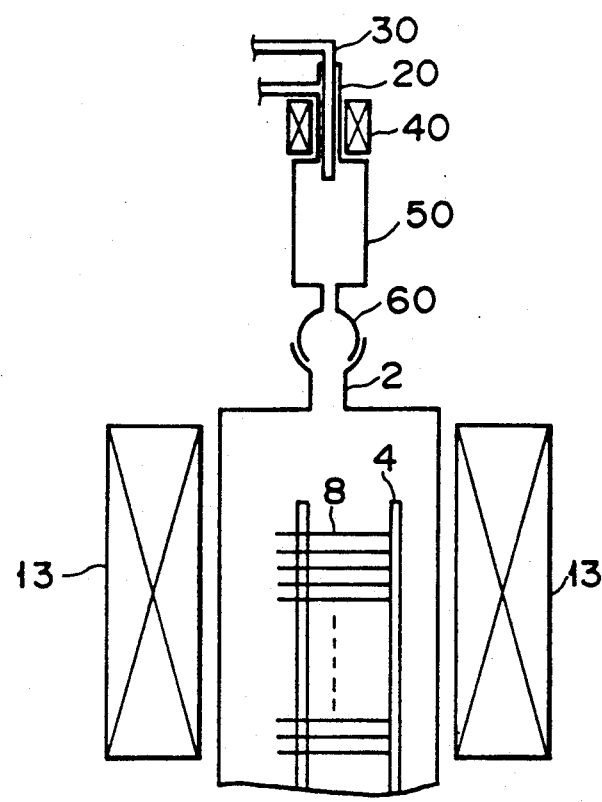
FIG. 7 is a schematic view for explaining another embodiment of the present invention adopting an external combustion system.

FIG. 7 shows another embodiment which uses the external combustion system. In this embodiment, cylindrical combustion chamber 50 is located above process tube 11. Hydrogen and oxygen gases are supplied from an upper end of process tube 11. Supply tube 60 at a lower end of external combustion unit 10 is connected to gas inlet port 12 of process tube 11 through a ball joint in which quartz tubes slide with each other. The other parts of the arrangement are the same as those of the above embodiment.

Note that the distance between unit 10 and process tube 11 can be reduced because the ball joint is used. As a result, moisture condensation as described above can be prevented without a tape heater or the like. When the distance between unit 10 and process tube 11 is reduced, the heat influence of unit 10 must be considered. In this case, however, process tube 11 may be connected to unit 10 by a ball joint with a distance by which tube 11 is not adversely affected by unit 10, or a partition for interrupting a flame may be formed at the side of supply tube 60.

Figure 8:
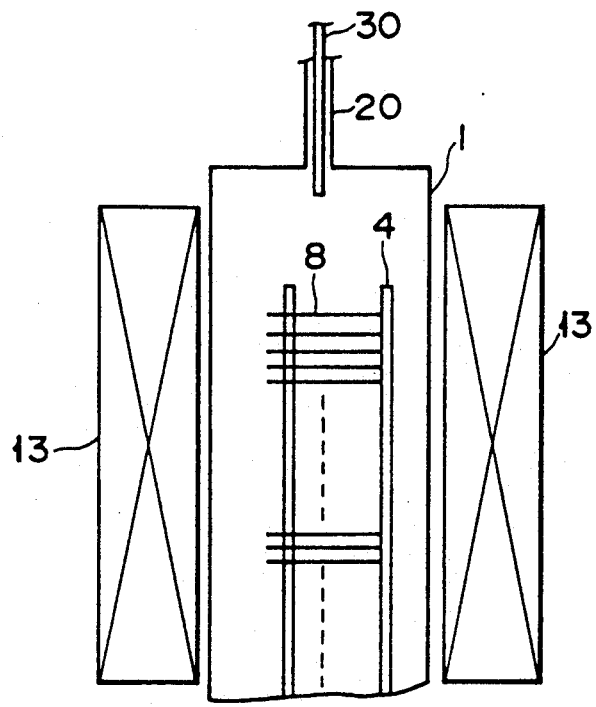
FIG. 8 is a schematic view for explaining still another embodiment of the present invention not using an external combustion unit.

FIG. 8 shows still another embodiment in which the external combustion unit 10 is not used, but a combustion region for generating steam is formed in the process tube 11. In this embodiment, oxygen and hydrogen gases are directly supplied in the process tube 11. Then, the gases are burned and combined using heater 13 for forming an oxide film, thereby generating steam.

With this arrangement, as compared with the external combustion system, it is difficult to uniformly control the temperature at the oxide film formation region in process tube 11. However, when a heating means for generation steam is located around process tube 11 independently of heater 13, the temperature of the oxide film formation region can be easily made uniform. In addition, the height of the vertical oxidation apparatus can be advantageously reduced.

When steam or oxygen and hydrogen gases are to be supplied to the vertical oxidation apparatus, the steam or the like is preferably supplied from an upper end of process tube 11. The reason for this is as follows. That is, a lower end of process tube 11 has an opening portion for transporting a quartz boat. For this reason, a steam supply port must be arranged at a position other than the opening portion. As a result, the arrangement of the apparatus is complicated. However, according to the present invention, a gas need not be supplied from the upper end. In addition, boat 14 need not be loaded from the lower end of the process tube 11 but may be loaded from the upper end thereof. Therefore, the steam supply position can be variously modified.

The present invention is not limited to the above embodiments but can be variously modified without departing from the spirit and scope of the invention.

For example, hydrogen gas guide tube 30 and oxygen gas guide tube 20 need not be constituted by a coaxial double tube but may be independently connected to combustion chamber 50. In this case, heating means 40 may be located at both or one of guide tubes 20 and 30. When the flow rates of oxygen and hydrogen gases are changed in accordance with the degree of oxidation, the size of the flame in combustion chamber 50 changes. In this case, according to the present invention, the discharge positions of guide tubes 20 and 30 can be easily changed so that the flame is not brought into contact with the wall surface of chamber 50. This arrangement can be easily realized because the heat source need not be located at the distal end of the guide tube unlike in the conventional apparatus.

If half heaters 41 and 42 of heating means 40 can be vertically opened, they may be opened to rapidly cool the guide tube. However, the present invention is not limited to this arrangement.

FIG. 9 shows still another embodiment in which an auxiliary combustion chamber is used. In this embodiment, gas burner 72 is connected to combustion chamber 50 through auxiliary combustion chamber 71. Burner 72 forms a hydrogen supply path. Central axis 72a of burner 72 coincides with central axis 50a of chamber 50. As shown in FIG. 10A, injection port 72b of burner 72 is formed concentrically with burner 72. Oxygen supply path 73 is formed on an outer surface of burner 72. Heater 74 is formed on an outer surface of oxygen supply path 73.

The diameter of chamber 71 is set so as to be larger than that of path 73.

In this oxidation apparatus, oxygen gas 75 is supplied to oxygen supply path 73. At the same time, hydrogen gas 76 is supplied to burner 72. Therefore, gas 76 is heated to its ignition temperature by heater 74 and discharged from burner 72. Then, gas 76 is ignited in chamber 71. When gas 76 is ignited to start combustion, an oxygen and hydrogen flame 77 is generated to generate steam. Flame 77 reaches a central portion of chamber 50 through chamber 71. However, base 77a of flame 77 is located on a central line 50a of chamber 50. For this reason, flame 77 does not reach inlet port upper wall portion 78 of chamber 50. Therefore, inlet port upper wall portion 78 is not heated to a high temperature. As a result, thermal damage to quartz forming chamber 50 or thermal decomposition of molecules in the quartz can be prevented.

Note that as shown in FIG. 10B, a central line 72c of injection port 72b can be inclined downwardly with respect to central axis 72a by angle $\theta$. In this case, the distal end portion of the oxygen and hydrogen flame facing upward is located near central line 50a of chamber 50. As a result, upper wall surface 50b of chamber 50 can be prevented from being heated by distal end portion 77b of the flame.

In addition, as shown in FIG. 11, central axis 72a of burner 72 may be located below central line 50a of chamber 50 so as to be eccentric therefrom. In this case, distal end portion 77b of flame 77 is set so as not to approach upper wall surface 50b of chamber 50.

Obviously, numerous modifications and variations of the present invention are possible in light of the above teachings. It is therefore to be understood that within the scope of the appended claims, the invention may be practiced otherwise than as specifically described herein.

What is claimed is:

1. An oxidation apparatus, comprising:
   a process tube adapted to contain a boat in which a plurality of objects to be processed are placed at predetermined intervals;
   first heating means for heating an interior of said process tube;
   a combustion chamber, located outside of and connected to said process tube via a connecting tube, for generating steam by combustion of a mixture of oxygen and hydrogen gases therein and supplying the steam to said process tube;
   a double-tube type structure connected to said combustion chamber, said double-tube type structure having outer and inner guide tubes for individually introducing the oxygen gas through said outer guide tube and the hydrogen gas through said inner guide tube into said combustion chamber;
   an auxiliary combustion chamber formed as an outlet portion of said outer guide tube;
   an injection nozzle formed as an outlet portion of said inner guide tube and located near a front end portion of said auxiliary combustion chamber; and
   second heating means provided around said outer guide tube for heating the gases to a temperature at which ignition of the gases occurs when the gases come into contact with each other; wherein said auxiliary combustion chamber comprises an enlargement portion of said outer guide tube sufficient in size to prevent a flame generated by combustion of the gases from reaching a surface of said auxiliary combustion chamber.

2. An apparatus according to claim 1, wherein a central line of said inner guide tube coincides with that of said combustion chamber.

3. An apparatus according to claim 2, wherein said injection nozzle is oriented at an angle sufficient to keep said flame from contacting a surface of said auxiliary combustion chamber or said combustion chamber.

4. An apparatus according to claim 1, wherein said inner guide tube is connected in a substantially horizontal manner to said combustion chamber.

5. An apparatus according to claim 4, wherein a central axis of said inner guide tube coincides with a central line of said combustion chamber.

6. An apparatus according to claim 5, wherein said injection nozzle is oriented at a downward angle sufficient to keep said flame from contacting a surface of one of said auxiliary combustion chamber and said combustion chamber.

7. An apparatus according to claim 4, wherein a central line of said inner guide tube is sufficiently lower than that of a combustion chamber to prevent said flame from reaching a surface of said combustion chamber.

8. An apparatus according to claim 1, which comprises a third heating means provided around said auxiliary combustion chamber.

9. An apparatus according to claim 8, wherein said third heating means is integrated with said second heating means.

10. An oxidation apparatus, which comprises:
a process tube adapted to contain a boat in which a plurality of objects to be processed are placed at predetermined intervals;
first heating means, for heating an interior of said process tube;
a combustion chamber, located outside of and connected to said process tube with a connecting tube, for generating steam by combustion of a mixture of oxygen and hydrogen gases therein and supplying the steam to said process tube;
a double-tube type structure connected to said combustion chamber, said double-tube type structure having outer and inner guide tubes for individually introducing the oxygen gas through said outer guide tube and the hydrogen gas through said inner guide tube into said combustion chamber;
an auxiliary combustion chamber formed as an outlet portion of said outer guide tube;
an injection nozzle formed as an outlet portion of said inner guide tube and located near a base of said auxiliary combustion chamber; and
second heating means, provided around said outer guide tube and auxiliary combustion chamber, for heating the gases to a temperature at which ignition of the gases occurs when said gases come into contact with each other wherein said auxiliary combustion chamber comprises an enlargement of said outer guide tube sufficient in size to prevent a flame generated by combustion of the gases from reaching a surface of said auxiliary combustion chamber.

11. An apparatus according to claim 10, wherein a central line of said inner guide tube coincides with that of said combustion chamber.

12. An apparatus according to claim 11, wherein said injection nozzle is oriented at an angle sufficient to keep said flame from contacting a surface of one of said auxiliary combustion chamber and said combustion chamber.

13. An apparatus according to claim 10, wherein said inner guide tube is connected in a substantially horizontal manner to said combustion chamber.

14. An apparatus according to claim 13, wherein a central axis of said inner guide tube coincides with a central line of said combustion chamber.

15. An apparatus according to claim 14, wherein said injection nozzle is oriented at a downward angle sufficient to keep said flame from contacting a surface of one of said auxiliary combustion chamber and said combustion chamber.

16. An apparatus according to claim 13, wherein a central line of said inner guide tube is sufficiently lower than that of combustion chamber to prevent said flame from reaching a surface of said combustion chamber.

* * * * *